United States Patent
Aggarwal et al.

(10) Patent No.: US 6,576,482 B1
(45) Date of Patent: Jun. 10, 2003

(54) ONE STEP DEPOSITION PROCESS FOR THE TOP ELECTRODE AND HARDMASK IN A FERROELECTRIC MEMORY CELL

(75) Inventors: Sanjeev Aggarwal, Plano, TX (US); Scott R. Summerfelt, Garland, TX (US); Stevan G. Hunter, Newton Meadows (SG)

(73) Assignees: Texas Instruments Incorporated, Dallas, TX (US); Agilent Technologies, Palo Alto, CA (US)

( * ) Notice: Subject to any disclaimer, the term of this patent is extended or adjusted under 35 U.S.C. 154(b) by 0 days.

(21) Appl. No.: 10/140,481

(22) Filed: May 7, 2002

(51) Int. Cl.[7] ...................... H01L 21/00; H01L 21/8242
(52) U.S. Cl. ............................ 438/3; 438/253; 438/396
(58) Field of Search .................. 438/3, 253–256, 438/396–399

(56) References Cited

U.S. PATENT DOCUMENTS

| | | | |
|---|---|---|---|
| 4,002,545 A | | 1/1977 | Fehiner et al. |
| 4,820,393 A | | 4/1989 | Brat et al. |
| 5,196,101 A | | 3/1993 | Thakor |
| 5,367,285 A | | 11/1994 | Swinehart et al. |
| 5,849,162 A | | 12/1998 | Bartolomei et al. |
| 5,977,582 A | * | 11/1999 | Fleming et al. .......... 257/310 |
| 6,002,174 A | | 12/1999 | Akram et al. |
| 6,177,284 B1 | * | 1/2001 | Horii et al. ............... 438/3 |
| 6,254,984 B1 | * | 7/2001 | Iyori ........................ 428/336 |
| 6,313,539 B1 | | 11/2001 | Yokoyama et al. |
| 6,316,801 B1 | | 11/2001 | Amanuma |
| 6,358,810 B1 | | 3/2002 | Dornfest et al. |
| 2001/0015448 A1 | * | 8/2001 | Kawakubo et al. ...... 257/296 |

OTHER PUBLICATIONS

Wolf et al., Silicon Processing for the VLSI Era, vol. 1–Process Technology, pp. 362–363 and 367, Lattic Press, 1986.*

* cited by examiner

Primary Examiner—John F. Niebling
Assistant Examiner—Jennifer M. Kennedy
(74) Attorney, Agent, or Firm—Jacqueline J. Garner; W. James Brady, III; Frederick J. Telecky, Jr.

(57) ABSTRACT

One aspect of the invention relates to a one-step process for forming a transition metal aluminum oxynitride layer over a transition metal aluminum nitride layer. The transition metal aluminum nitride layer is sputter deposited using a transition metal/aluminum target in an atmosphere containing nitrogen. Subsequently, the oxygen content of the atmosphere is increased, whereby the transition metal aluminum oxynitride layer can be deposited without interrupting the process or otherwise reconditioning the target. Another aspect of the invention relates to depositing a transition metal aluminum nitride layer over a transition metal aluminum oxynitride layer by reducing the oxygen content of the atmosphere. The invention provides a one-step process for depositing a hard mask layer and upper diffusion barrier layer for the capacitor stack of a FeRAM. A top electrode, such as an Ir/IrO electrode, can be deposited as part of the one-step process.

29 Claims, 2 Drawing Sheets

ONE STEP DEPOSITION PROCESS FOR THE TOP ELECTRODE AND HARDMASK IN A FERROELECTRIC MEMORY CELL

FIELD OF THE INVENTION

The present invention relates generally to the field of integrated circuit processing, and more particularly relates to a method of manufacturing an FeRAM.

BACKGROUND OF THE INVENTION

The semiconductor industry has long faced a demand for small, portable personal devices. These devices include cellular phones, personal computing equipment, and personal sound systems, which are sought in continuously smaller sizes and with continuously lower power requirements. At the same time that smaller and more portable personal devices are sought, computational power and on-chip memory requirements are increasing. In light of these requirements, there has been a long-felt need for computational devices that have substantial memory and logic functions integrated within individual semiconductor chips. Preferably, the memory is configured such that if power is interrupted, as when a battery fails, the contents of the memory are retained. Memory that retains its content without a continuous supply of power is called non-volatile memory. Conventional non-volatile memory types include: electrically erasable, programmable read only memory (EEPPROM) and flash EEPROM.

Ferroelectric random access memory (FeRAM) is a type of non-volatile memory that stores data in memory cells that include capacitors employing a ferroelectric material, such as SBT or PZT, as the dielectric. The non-volatility of FeRAMs results from the bi-stable characteristic of ferroelectric materials. At least two types of ferroelectric memory cells are used, single capacitor memory cells and dual capacitor memory cells. The single capacitor memory cell (referred to as a 1T/1C or 1C memory cell) requires less silicon area and thereby increases the potential density of the memory array, but is less immune to noise and process variations. A 1C cell requires a voltage reference for determining a stored memory state. The dual capacitor memory cell (referred to as a 2T/2C or 2C memory cell) requires more silicon area and stores complementary signals allowing differential sampling of the stored information. The 2C memory cell is more stable than the 1C memory cell.

As illustrated in prior art FIG. 1, a 1T/1C FeRAM cell 100 includes a transistor 110 and a ferroelectric storage capacitor 120. The transistor 110 includes a gate 112, a source 114, and a drain 116. The storage capacitor 120 includes a bottom electrode 122, a top electrode 124, and a ferroelectric core. The drain 116 of the transistor 110 is connected to the bottom electrode 122 of the capacitor 120. The source 114 of the transistor 110 is connected to a bit line 132 (BL). The 1T/1C cell 100 is read by a pplying a signal to the gate 112 through a word line 130 (WL), switching on the transistor 110. This brings the bottom electrode 122 of the capacitor 120 into communication with the bit line 132. Then, though a drive line 134 (DL), a pulse signal is applied to the top electrode 124 of the capacitor 120. The potential on the bit line 132 becomes the capacitor charge divided by the bit line capacitance. Since the capacitor charge is dependent upon the bi-stable polarization state of the ferroelectric core, the bit line potential can have two distinct values. A sense amplifier (not shown) is connected to the bit line 132 and detects the voltage associated with a logic value of either 1 or 0. Frequently the sense amplifier reference voltage is a ferroelectric or non-ferroelectric capacitor connected to another bit line that is not being read. In this manner, the data stored in the 1T/1C cell 100 is retrieved.

A characteristic of the cell 100 is that read operations are destructive. After a read operation, the data is rewritten to restore its value. This is similar to the way a DRAM operates. A difference from a DRAM, however, is that the ferroelectric memory cell retains its state until it is interrogated, thereby eliminating the need for refresh.

Prior art FIG. 2, illustrates a 2T/2C memory cell 200. The memory cell 200 comprises two transistors 202 and 204 and two ferroelectric capacitors 206 and 208, respectively. The first transistor 202 couples between a bit line 210 and the first capacitor 206. The second transistor 204 couples between a bit line-bar 212 and the second capacitor 208. The capacitors 206 and 208 are connected to a common drive line 214 (DL), to which a signal is applied for polarizing the capacitors.

In a write operation, the first and second transistors 202 and 204 of the dual capacitor ferroelectric memory cell 200 are enabled via a word line 216 (WL) to couple the capacitors 206 and 208 to the complementary logic levels on the bit line 210 and the bit-bar line 212. The common drive line 214 of the capacitors is pulsed during the write operation to polarize the dual capacitor memory cell 200 to one of two logic states.

In a read operation, the first and second transistors 202 and 204 are enabled via the word line 216 to couple the information stored on the first and second capacitors 206 and 208 to the bit line 210 and the bit line-bar line 212, respectively. A differential signal (not shown) is thus generated across the bit line 210 and the bit line-bar line 212. A sense amplifier (not shown) senses the differential signal and determines the logic level stored in memory.

Forming devices with FeRAM presents several challenges. The ferroelectric capacitor alone requires many separate layers. In addition to the ferroelectric material and top and bottom electrode layers, diffusion barrier layers are generally required between the bottom electrode and the plug that contacts the transistor drain and between the top electrode and the upper contact. The electrodes themselves are often provided in two layers to address resistance requirements and material compatibility requirements. These various layers comprising diverse materials must all be deposited and etched without causing contamination between the various structures of the semiconductor device. It is also desirable to limit the number and complexity of processing steps. In view of these challenges, there has been a long felt need for improved FeRAM manufacturing processes.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

One aspect of the invention relates to a processing method useful in the formation of an FeRAM having a transition metal aluminum nitride upper diffusion barrier layer. The method provides a one-step process for forming a transition metal aluminum oxynitride layer over a transition metal aluminum nitride layer. The transition metal aluminum oxynitride layer can serve as a hard mask layer and can also become part of the upper diffusion barrier layer. According to the invention, a transition metal aluminum nitride layer is sputter deposited using a transition metal/aluminum target in an atmosphere containing nitrogen. Subsequently, the oxygen content of the atmosphere is increased, whereby a transition metal aluminum oxynitride layer is deposited without otherwise reconditioning the target. The invention eliminates the need to interrupt processing while conditioning the target with oxygen or replacing the target, thus making into a one-step process a deposition of layers previously thought to require a two-step process. A top electrode, such as an Ir/IrO electrode, can also be deposited as part of the one-step process.

According to another aspect of the invention, a transition metal aluminum nitride layer is sputter-deposited over a transition metal aluminum oxynitride layer by reducing the oxygen content of the atmosphere, again without otherwise preconditioning the target. Thus, alternating layers of transition metal aluminum nitride and transition metal aluminum oxynitride are deposited in a single sputter-deposition chamber without reconditioning or replacing the target between depositions. This process is useful in depositing multi-layer hard masks that are used to etch capacitor stacks. This process is also useful in processing multiple batches in a FeRAM manufacturing process.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
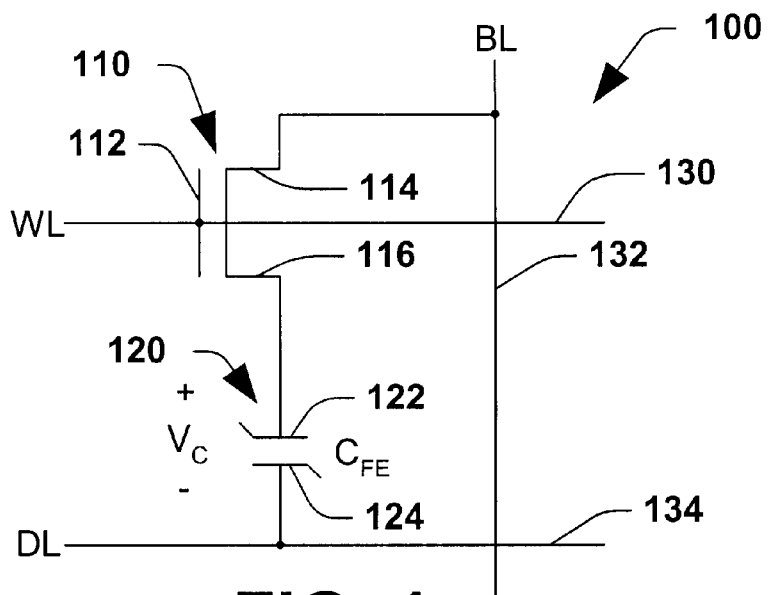
FIG. 1 is a schematic diagram illustrating an exemplary prior art 1T/1C FeRAM memory cell.
Figure 2:
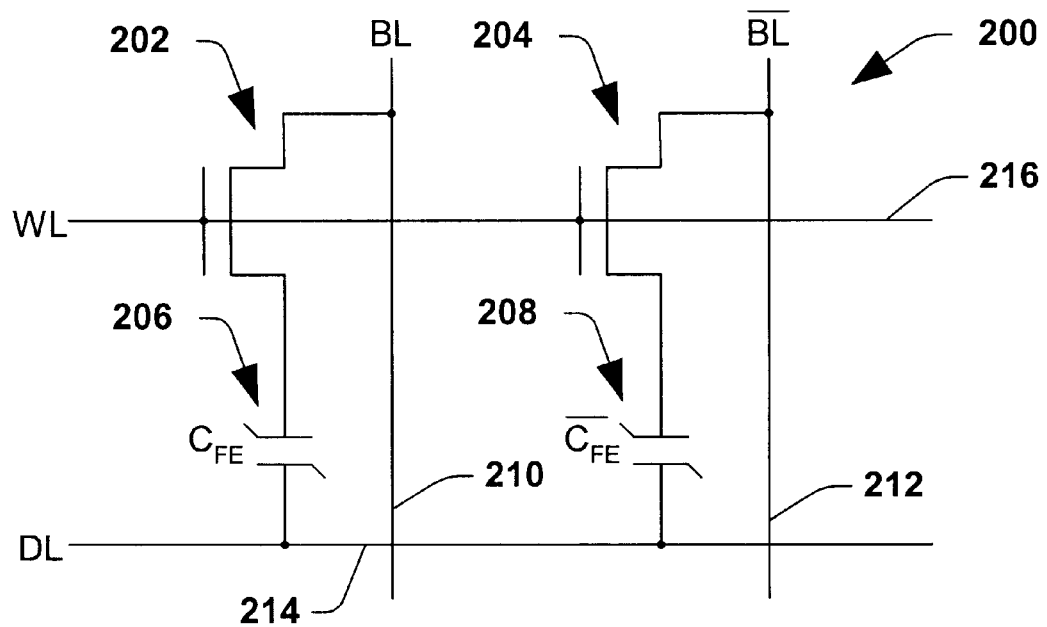
FIG. 2 is a schematic diagram illustrating an exemplary prior art 2T /2C FeRAM memory cell.
Figure 3:
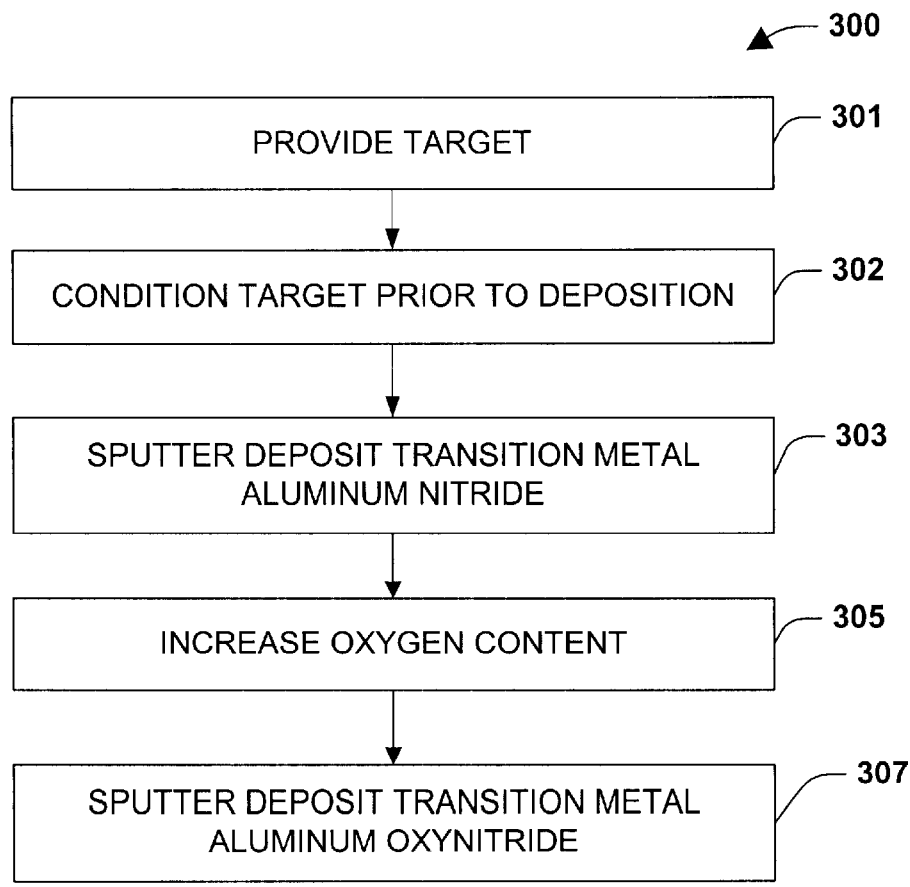
FIG. 3 is a flow chart illustrating a process according to one aspect of the present invention.

The present invention will now be described with reference to the attached drawings, wherein like reference numerals are used to refer to like elements throughout. FIG. 3 provides a flow chart of a process 300 for depositing successive layers of a transition metal aluminum nitride and a transition metal aluminum oxynitride over a substrate in accordance with one aspect of the present invention. Although the process 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with trimming or adjustment operations using the trim circuitry illustrated and described herein as well as in association with other devices not illustrated.

Process 300 includes providing a transition metal/aluminum alloy target, act 301, conditioning the alloy target, act 302, sputter depositing a layer of transition metal aluminum nitride on the substrate using the target in an atmosphere containing nitrogen, act 303, increasing an oxygen content of the atmosphere, act 305, and sputter depositing the layer of transition metal aluminum oxynitride, act 307. Increasing the oxygen content is sufficient to initiate deposition of the transition metal aluminum oxynitride. No other conditioning of the target is required between depositing the two layers in acts 303 and 307 and it is unnecessary to interrupt the deposition process to recondition the target. Thus, the two layers can be deposited in a single step or stage of a manufacturing process.

The target provided by act 301 comprises a transition metal and aluminum. Titanium and tantalum are examples of transition metals. Both are suitable for use in process 300. The target typically contains about 30 to about 50 atomic percent of the transition metal and about 50 to about 70 atomic percent aluminum. For example, a target containing about 40 atomic percent transition metal and about 60 atomic percent aluminum can be used. The target is placed in a deposition chamber along with the substrate on which the layers are to be deposited. Prior to the first deposition, the target is first conditioned at 302 by using it to deposit transition metal aluminum oxynitride on a sacrificial substrate or shield plate, and such conditioning may differ depending on whether the first layer to be deposited is a transition metal aluminum nitride or a transition metal aluminum oxynitride.

In the case where the first layer to be formed is a transition metal aluminum nitride, the target is nitrided before the deposition. For example, a fresh surface of the transition metal aluminum target is exposed using an inert gas sputtering process, followed by an extended deposition of the transition metal aluminum nitride in a nitrogen rich ambient, for example, an ambient containing about 140% of the amount of nitrogen typically used in regular deposition. In one particular example, if the transition metal aluminum nitride recipe employs about 55 sccm $N_2$, then the conditioning process utilizes about 75 sccm $N_2$.

With regard to the case when the first layer to be formed is a transition metal aluminum oxynitride, the target may be conditioned, for example, by using it to deposit a 200 nm thick layer at 400° C. with a feed gas of 25 sccm Ar, 56 sccm $N_2$, and 9 sccm $O_2$. In doing so, the target is partially oxidized prior to the transition metal aluminum oxynitride deposition. Again, a fresh surface of the transition metal aluminum target is exposed, followed by a nitridation-oxidation step. For example, an extended deposition is performed in a nitrogen ambient (e.g., about 55 sccm) and oxygen ambient (e.g., 20 sccm). The choice of oxygen, in one aspect of the present invention, is important to the target conditioning. For example, a 9 sccm conditioning flow of oxygen is sufficient to subsequently deposit $TiAlO_{0.08}N_{0.92}$ films that use only about 5 sccm $O_2$ during deposition.

Therefore in accordance with the above examples, depositing a thick $TiAlO_{0.25}N_{0.75}$ film would be appropriate conditioning for subsequent deposition of $TiAlO_{0.08}N_{0.92}$ films, and depositing a thick $TiAlO_{0.5}N_{0.5}$ film would be appropriate conditioning for subsequent deposition of $TiAlO_{0.25}N_{0.75}$ films, respectively. In addition, in one exemplary aspect of the present invention, the conditioning film may be deposited either on a sacrificial substrate or a shutter plate.

The substrate usually includes a semiconductor. Examples of semiconductors include, without limitation, Si, GaAs, and InP. In addition to a semiconductor, the substrate may include various elements therein and/or layers thereon. These can include metal layers, barrier layers, dielectric layers, device structures, active elements and passive elements including gates, word lines, source regions, drain regions, bit lines, bases, emitters, collectors, conductive lines, conductive vias, etc.

In act 303, the target provided by act 301 is used in depositing a layer of transition metal aluminum nitride on the substrate by reactive sputtering. Gases, including at least nitrogen and generally an inert gas, such as argon, flow into the deposition chamber and provide a nitrogen-containing atmosphere in which deposition takes place. Generally, the atmosphere contains little or no oxygen at this point in the process. The target is bombarded to release transition metal and aluminum, which react with the nitrogen and deposit to form a transition metal aluminum nitride layer on the substrate. In one embodiment, the transition metal aluminum nitride layer is at least about 10 nm thick. In another embodiment, the transition metal aluminum nitride layer is at least about 30 nm thick. In a further embodiment, the transition metal aluminum nitride layer is at least about 100 nm thick.

After depositing transition metal aluminum nitride, the oxygen content of the atmosphere (e.g., within the deposition chamber) is increased in act 305, whereby deposition of the transition metal aluminum oxynitride layer is initiated. The same target is used to deposit the transition metal aluminum oxynitride layer as was used to deposit the transition metal aluminum nitride layer. Preferably, the deposition process is not interrupted between depositing the two layers and preferably there is no conditioning of the target between depositing the two layers, except such conditioning as may occur as a result of changing the oxygen content of the atmosphere. Preferably, the atmosphere within the deposition chamber has a composition similar to that of the feed gases and experiences similar increases. Preferably, the proportion between oxygen and nitrogen in the feed gases is increased to at least about 1:10, more preferable to at least about 1:8, and still more preferably to at least about 1:6.

After increasing the oxygen content in act 305, a layer of titanium aluminum oxynitride is deposited in act 307. For example, a transition metal aluminum oxynitride layer from about 10 nm to about 50 nm in thickness can be deposited over the titanium aluminum nitride layer. Preferably, the ratio between oxygen and nitrogen in the transition metal aluminum oxynitride layer is at least about 1:5, more preferably at least about 1:4, still more preferably at least about 1:3. It is difficult to switch from depositing transition metal aluminum nitride to depositing a transition metal aluminum oxynitride having an oxygen to nitrogen ratio less than about 1:10 without interrupting the deposition process to condition the target. The one-step process works better with higher oxygen concentrations.

By a similar method, a transition metal aluminum nitride layer can be deposited over a transition metal aluminum oxynitride layer. The oxygen content of the atmosphere is lowered, whereupon transition metal aluminum nitride begins to deposit without otherwise conditioning the target between layer depositions. Accordingly, alternating layers of transition metal aluminum nitride and transition metal aluminum oxynitride can be deposited over a single substrate without interrupting the deposition process to condition the target. By the same token, layers of transition metal aluminum nitride and transition metal aluminum oxynitride can be deposited on multiple substrates, provided in multiple batches, without reconditioning the target between batches.

When bi-layers of transition metal aluminum nitride and transition metal aluminum oxynitride, or tri-layers of a first transition metal aluminum nitride, a transition metal aluminum oxynitride, and a second transition metal aluminum nitride are deposited on multiple batches of substrates without reconditioning the target between batches or layers, some variability is observed among the first few batches as compared to later batches. This is believed to be due to the affinity of the target for oxygen, whereby the target retains significant oxygen content, even when a thickness of transition metal aluminum nitride greater than 100 nm is deposited in a pure nitrogen atmosphere between transition metal aluminum oxynitride layer depositions. The target can be preconditioned to mitigate this variability by depositing alternating layers of transition metal aluminum nitride and transition metal aluminum oxynitride on a sacrificial substrate prior to processing substrates on which the layers are desired.

Figure 4:
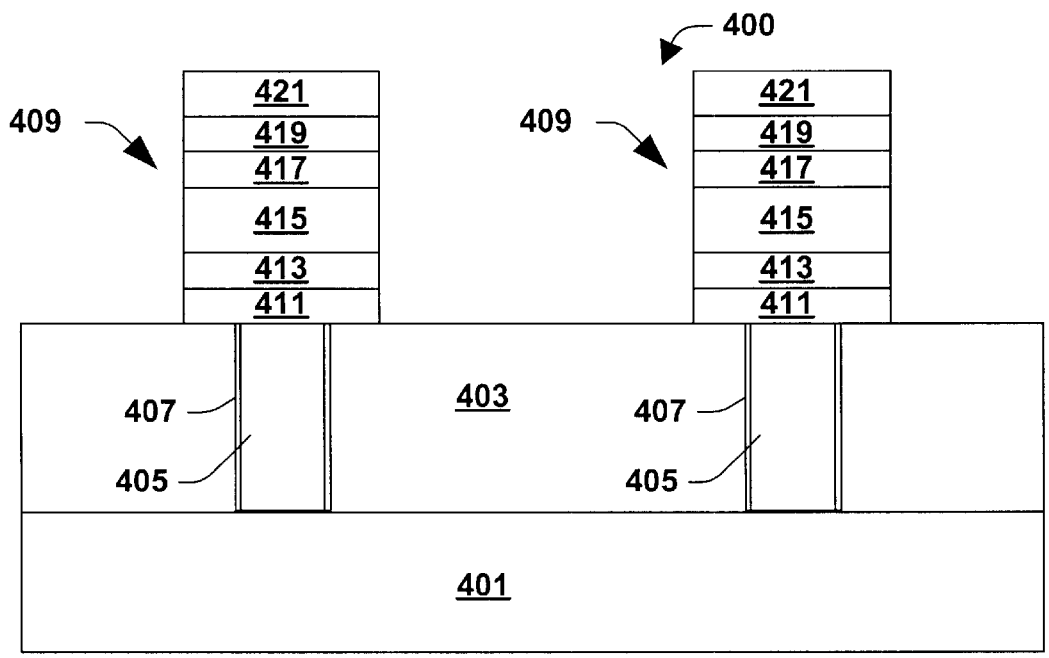
FIG. 4 is a high level schematic of a capacitor stack.

The present invention arose in the context of, and is applicable, to the manufacture of an FeRAM. FIG. 4 is a schematic illustration of a capacitor stack for an FeRAM device 400. Device 400 includes capacitor stacks 409, which are connected by conductive plugs 405 in dielectric 403 to drain regions of transistors (not shown) formed within substrate 401. A diffusion barrier 407 prevents contamination of the dielectric 403 and adjacent structures by the plugs 405.

Significant integration issues are presented in forming the capacitor stacks 409. The capacitor stacks 409 include a lower diffusion barrier 411, a bottom electrode 413, a ferroelectric dielectric layer 415, a top electrode 417, an upper diffusion barrier 419, and a hard mask 421. In accordance with one exemplary aspect of the present invention, the top electrode 417, the diffusion barrier 419 and the hard mask 421 are deposited in a one-step type process, and in one particular example the diffusion barrier 419 comprises TiAlN while the hard mask comprises a bi-layer of TiAlO$_{0.25}$N$_{0.75}$ followed by TiAlN. The hard mask 421 optionally remains as part of the finished device and functions as part of the upper diffusion barrier layer. One of the integration issues is the selection of a material for the lower diffusion barrier 411. Titanium aluminum nitride was found to be subject to undercutting during etching of the capacitor stacks 409. Undercutting can result in poor step coverage of sidewall diffusion barriers (not shown) that are subsequently formed to isolate the capacitor stacks 409. Adding a small amount of oxygen to form titanium aluminum oxynitride in the lower diffusion barrier mitigates this undercutting without unduly increasing resistance.

The use of a titanium aluminum oxynitride lower diffusion barrier presents further integration issues. A titanium aluminum oxynitride lower diffusion barrier layer 411 presents a challenge in selecting an appropriate hard mask 421 to use in etching the capacitor stacks 409. In principle, the hard mask 421 can be made from titanium aluminum nitride, which is also used in the upper diffusion barrier 419. However, because titanium aluminum oxynitride etches much more slowly that titanium aluminum nitride, a very thick titanium aluminum nitride layer would be required to act as a hard mask. The titanium aluminum nitride layer remaining after the capacitor stack etch would be expected to have problems of non-uniformity and corner rounding.

A suitable hard mask 421 includes a layer of titanium aluminum oxynitride with an oxygen content equal to or greater than that of the lower diffusion barrier 411. Preferably, the lower diffusion barrier 411 contains no more than about a 1:10 atomic ratio between oxygen and nitrogen whereas the upper diffusion barrier layer preferably contains an atomic ratio of at least about 1:5. For example, the lower diffusion barrier layer can be $TiAlO_{0.08}N_{0.92}$ while the hard mask can be $TiAlO_{0.25}N_{0.75}$. Preferably, the oxygen contents are limited whereby the diffusion barrier layers have resistivities no greater than about 4300 $\mu\Omega$-cm each, more preferably no greater than about 1000 $\mu\Omega$-cm.

A titanium aluminum oxynitride hard mask or upper diffusion barrier layer cannot, in general, be formed directly over the top electrode 417. In general, the top electrode 417 cannot be subjected to an oxidizing atmosphere as would normally be used in forming titanium aluminum oxynitride. Therefore, it is desirable to form a titanium aluminum nitride diffusion barrier layer 419 over the top electrode and then form a titanium aluminum oxynitride diffusion barrier/hard mask 421 thereover. The upper diffusion barrier 419 and the hard mask 421 preferably include a titanium aluminum nitride layer from about 10 nm to about 50 nm thick and a titanium aluminum oxynitride layer from about 10 nm to about 50 nm thick. These two layers can be deposited in a one-step sputter deposition process as described above, wherein the transition from depositing titanium aluminum nitride to titanium aluminum oxynitride is accomplished by increasing the concentration of oxygen in the feed gases. By contrast, a target is generally preconditioned with oxygen prior to depositing the lower diffusion barrier layer in view of the lower oxygen content of that layer as compared to the upper diffusion barrier. The diffusion barrier layers and hard mask can be deposited at any suitable temperature, preferably a temperature from about 350° C. to about 450° C.

The diffusion barriers and hard mask can include another transition metal along with, or in place of, titanium. For example, the diffusion barriers and hard mask can be made from tantalum aluminum nitride and tantalum aluminum oxynitride. The lower diffusion barrier is generally selected for compatibility with, and to provide protection for, the material used to form plugs 405. The plug material can be, for example, a metal such as tungsten, molybdenum, aluminum, or copper. The upper diffusion barrier is selected for compatibility with a contact, which generally includes a metal.

The electrodes 413 and 417 can be formed of any suitable electrode material. Electrode materials include, without limitation, Pt, Pd, PdOx, IrPt alloys, Au, Ru, $RuO_x$, (Ba,Sr,Pb)RuO3, (Sr,Ba,Pb)IrO3, Rh, $RhO_x$, LaSrCoO$_3$, (Ba,Sr)RuO$_3$, or LaNiO$_3$. For a PZT dielectric, it is preferred that an oxide electrode, such as $IrO_x$, be in contact the dielectric to aid in capacitor fatigue resistance. In addition, it is preferred to have a noble metal between the oxide electrode and the top and bottom diffusion barriers. The noble metal prevents oxidation of the diffusion barrier and the resulting formation of an insulating layer that would increase contact resistance. The preferred thickness of the oxide electrode layer is from about 20 nm to about 100 nm. The preferred thickness of the noble metal electrode layer is from about 10 nm to about 100 nm. For example, a 20 nm iridium/30 nm iridium oxide electrode can be employed. The electrodes can be sputter deposited using, for example, an iridium target at a temperature in the range from about 500° C. to about 550° C. Iridium is deposited in an inert atmosphere, such as Ar, with essentially no oxygen. Iridium oxide is deposited by including from about 30 to about 50 mole percent oxygen in the atmosphere, for example.

The top electrode 417 can often be deposited in a one-step process along with the upper diffusion barrier 419 and the hard mask 421. For example, where the top electrode includes iridium oxide and iridium, a second target, one containing iridium, is included along with the transition metal/aluminum target. The transition from depositing iridium oxide to iridium is accomplished by reducing or eliminating the oxygen content in the feed gases.

The ferroelectric dielectric 415 can include any suitable material. Options include Pb(Zr,Ti)O$_3$ (PZT), doped PZT with donors (Nb, La, Ta) acceptors (Mn, Co, Fe, Ni, Al) and/or both, PZT doped and alloyed with SrTiO$_3$, BaTiO$_3$ or CaTiO$_3$, strontium bismuth tantalate (SBT) and other layered perovskites such as strontium bismuth niobate tantalate (SBNT) or bismuth titanate, BaTiO$_3$, PbTiO$_3$, Bi$_2$TiO$_3$, etc.

The capacitor stack etch can remove a small amount of the dielectric 403. Alternatively, an additional diffusion barrier/etch stop layer can be included on top of dielectric 403, such as a layer including $AlO_x$, AlN, Si$_3$N$_4$, TiO$_2$, ZrO$_2$, or $TaO_x$. The dielectric 403 can include any suitable insulating material, such as, for example, silicon dioxide or a high-k dielectric.

If an upper diffusion barrier layer of transition metal aluminum oxynitride is the only hard mask used in etching the capacitor stack, there is some risk that the transition metal aluminum oxynitride may become damaged, contaminated, or excessively non-uniform in thickness. For this reason, it may be desirable to employ a sacrificial layer of transition metal aluminum nitride over the titanium aluminum oxynitride. For example, a sacrificial layer from about 100 nm to about 300 nm can be employed, as in a multi-layer diffusion barrier/hard mask including a 30 nm first titanium aluminum nitride layer, a 30 nm titanium aluminum oxynitride layer, and a 200 nm second titanium aluminum nitride layer. The process used to etch the capacitor stack removes the sacrificial layer. The titanium aluminum oxynitride hard mask then acts as an etch stop. With respect to a chlorine etch chemistry, a titanium aluminum oxynitride hard mask can exhibit an etch selectivity of at least about 10:1 against titanium aluminum nitride.

Three layers, including a titanium aluminum nitride upper diffusion barrier layer, a titanium aluminum oxide diffusion barrier/hard mask layer, and a titanium aluminum nitride sacrificial/hard mask layer, can all be deposited in a one-step process as described above, optionally along with the top electrode.

Whether or not a sacrificial layer is included, the hard mask 421 is lithographically patterned. For example, a deep UV resist can be patterned and the hard mask 421 etched using a high-density plasma and a Cl$_2$+BCl$_3$ gas chemistry. The resist is removed and the capacitor stack etched using the hard mask. The electrodes can be etched chemically using Cl$_2$+O$_2$ or Cl$_2$+CO, optionally together with N$_2$. A fluorine containing gas can be added to etch the dielectric core 415. A Cl$_2$+BCl$_3$ gas chemistry can also be used to etch the dielectric core 415.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of successively depositing layers of a transition metal aluminum nitride and a transition metal aluminum oxynitride over a substrate, comprising:

providing a target comprising a transition metal/aluminum alloy;

conditioning the target before depositing a layer of transition metal aluminum nitride;

sputter depositing the layer of transition metal aluminum nitride on the substrate using the target in an atmosphere; and increasing an oxygen content of the atmosphere to begin sputter depositing a layer of transition metal aluminum oxynitride over the transition metal aluminum nitride layer using the same target.

2. The method of claim 1, wherein the transition metal comprises titanium.

3. The method of claim 1, wherein the transition metal aluminum oxynitride has an atomic ratio of oxygen to nitrogen of at least about 1:5.

4. The method of claim 1, wherein the oxygen content is increased to the extent that the atmosphere contains at least about 10 mole percent oxygen or a ratio of at least about 1:10 oxygen to nitrogen.

5. The method of claim 1, wherein the transition metal aluminum nitride layer has a thickness in the range from about 10 nm to about 50 nm.

6. The method of claim 1, wherein the transition metal aluminum oxynitride layer has a thickness in the range from about 10 nm to about 50 nm.

7. The method of claim 1, wherein conditioning the target comprises:

exposing a surface of the target using an inert gas sputtering process; and performing a conditioning transition metal aluminum nitride deposition on a shutter plate or a sacrificial substrate in a nitrogen rich deposition ambient, wherein an amount of nitrogen in the deposition ambient comprises about 140% of nitrogen in the environment employed in the sputter depositing of the layer of transition metal aluminum nitride of claim 1.

8. A method of depositing layers of a transition metal aluminum nitride and a transition metal aluminum oxynitride on a group of semiconductor substrate, comprising:

successively processing batches of the semiconductor substrates according the method of claim 1, wherein the target is not conditioned between two or more of the successive batches.

9. The method of claim 8, wherein the target is preconditioned by alternately depositing layers of transition metal aluminum nitride and transition metal aluminum oxynitride.

10. The method of claim 8, wherein the target is preconditioned to deposit one of the transition metal aluminum nitride layer or the transition metal aluminum oxynitride layer on a batch, followed by reconditioning the target to deposit another of the layers, respectively.

11. A method of successively depositing a first layer of transition metal aluminum nitride, a layer of transition metal aluminum oxynitride, and a second layer of transition metal aluminum nitride on a substrate, comprising:

depositing the first layer of transition metal aluminum nitride and the layer of transition metal aluminum oxynitride according to the method of claim 1; and changing the oxygen content a second time to begin sputter depositing the second layer of transition metal aluminum nitride over the transition metal aluminum oxynitride layer using the same target.

12. The method of claim 11, wherein the target is preconditioned by alternately depositing layers of transition metal aluminum nitride and transition metal aluminum oxynitride.

13. The method of claim 11, wherein the target is preconditioned to deposit one of the transition metal aluminum nitride layer or the transition metal aluminum oxynitride layer on a batch, followed by reconditioning the target to deposit another of the layers, respectively.

14. The method of claim 11, wherein the first layer of transition metal aluminum nitride layer has a thickness in the range from about 10 nm to about 50 nm, the transition metal aluminum oxynitride layer has a thickness in the range from about 10 nm to about 50 nm, and the second layer of transition metal aluminum nitride layer has a thickness in the range from about 100 nm to about 300 nm.

15. A method of depositing a first layer of transition metal aluminum nitride, a layer of transition metal aluminum oxynitride, and a second layer of transition metal aluminum nitride on a group of semiconductor substrates, comprising:

successively processing batches of the semiconductor substrates according the method of claim 11, wherein the target is not conditioned between two or more of the successive batches.

16. A method of forming an FeRAM, comprising:

forming a transistor in a semiconductor substrate;

forming an interlayer dielectric layer over the transistor;

forming a conductive contact in the dielectric layer to connect to a portion of the transistor;

forming a bottom electrode diffusion barrier layer over the contact;.

forming a bottom electrode layer, a ferroelectric dielectric layer, and a top electrode layer over the bottom electrode diffusion barrier layer;

forming a transition metal/aluminum nitride top electrode diffusion barrier layer and a transition metal aluminum oxynitride hard mask layer over the top electrode layer according to the method of claim 1;

patterning the hard mask; and selectively etching the top electrode layer, the ferroelectric dielectric layer, and the bottom electrode layer to define a capacitor stack using the hard mask.

17. The method of claim 16, wherein the bottom electrode diffusion barrier layer comprises a transition metal aluminum oxynitride, a transition metal aluminum nitride, or a transition metal nitride.

18. The method of claim 17, wherein the bottom electrode diffusion barrier layer comprises a transition metal aluminum oxynitride having a first oxygen content and the hard mask layer includes a transition metal aluminum oxynitride having a second, greater oxygen content.

19. The method of claim 18, wherein an etch rate associated with the hard mask includes a transition metal aluminum oxynitride layer having an etch rate at least about 3 times slower than bottom electrode diffusion barrier layer with respect to a chemistry employed to etch the bottom electrode diffusion barrier layer.

20. The method of claim 16 wherein the top electrode diffusion barrier layer and the hard mask layer comprise successive layers of a first transition metal aluminum nitride, a transition metal aluminum oxynitride, and a second transition metal aluminum nitride.

21. The method of claim 16, wherein the top electrode, the top electrode diffusion barrier layer, and the hard mask layer are all formed in a single process sequence using two sputter deposition chambers, one with an iridium target and another with a TiAl target.

22. The method of claim 21, wherein forming the top electrode layer comprises:
   providing the iridium target;
   sputter depositing a layer of iridium oxide in an atmosphere; and
   decreasing an oxygen content of the atmosphere to begin sputter depositing an iridium layer over the iridium oxide layer.

23. The method of claim 22, further comprising preconditioning the iridium target prior to sputter depositing the iridium oxide layer by sputter depositing a layer of iridium oxide on a shutter plate or sacrificial substrate in the atmosphere.

24. The method of claim 22, wherein forming the top electrode comprises:
   conditioning the iridium target for formation of iridium oxide for a plurality of wafers;
   sputter depositing a layer of iridium oxide in an atmosphere for the plurality of wafers;
   conditioning the iridium target for formation of iridium for the plurality of wafers; and
   sputter depositing a layer of iridium in the atmosphere for the plurality of wafers.

25. The method of claim 21 wherein the FeRAM is formed in a commercial production scale process.

26. A method of successively depositing layers of a transition metal aluminum oxynitride nitride and a transition metal aluminum nitride on a semiconductor substrate, comprising:
   providing a target comprising a transition metal/aluminum alloy;
   sputter depositing a layer of transition metal aluminum oxynitride on the substrate using the target in an atmosphere having an oxygen content; and
   reducing the oxygen content to begin sputter depositing a layer of transition metal aluminum nitride over the transition metal aluminum oxynitride layer using the same target.

27. A method of successively depositing layers of a transition metal aluminum nitride and a transition metal aluminum oxynitride on a semiconductor substrate, comprising:
   placing the substrate in a chamber having a target comprising a transition metal/aluminum alloy;
   sputter depositing a layer of transition metal aluminum nitride on the substrate by bombarding the target with high energy ions while flowing gas comprising nitrogen into the chamber; and
   changing oxygen content in the gas to begin sputter depositing a layer of transition metal aluminum oxynitride over the transition metal aluminum nitride without otherwise changing the condition of the target.

28. The method of claim 27 wherein the gas flowed into the chamber is changed to include at least about 10 mole percent oxygen.

29. The method of claim 1, wherein the atmosphere comprises $Ar/N_2$.

* * * * *